(12) United States Patent
Church et al.

(10) Patent No.: US 7,700,977 B2
(45) Date of Patent: Apr. 20, 2010

(54) INTEGRATED CIRCUIT WITH A SUBSURFACE DIODE

(75) Inventors: Michael David Church, Sebastian, FL (US); Alexander Kalnitsky, San Francisco, CA (US); Lawrence George Pearce, Palm Bay, FL (US); Michael Ray Jayne, Satellite Beach, FL (US); Thomas Andrew Jochum, Durham, NC (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 12/037,569

(22) Filed: Feb. 26, 2008

(65) Prior Publication Data

US 2008/0315329 A1 Dec. 25, 2008

Related U.S. Application Data

(60) Provisional application No. 60/945,451, filed on Jun. 21, 2007.

(51) Int. Cl.
*H01L 23/62* (2006.01)
(52) U.S. Cl. .................. 257/199; 257/106; 257/355
(58) Field of Classification Search .................. 257/104, 257/105, 106, 367, 355, 199
See application file for complete search history.

(56) References Cited

U.S. PATENT DOCUMENTS 4,736,271 A 4/1988 Mack
5,336,920 A * 8/1994 Jimenez .................. 257/481
5,357,126 A 10/1994 Jimenez
5,612,564 A 3/1997 Fujishima et al.
6,191,455 B1 2/2001 Shida
7,056,761 B1 * 6/2006 Vashchenko et al. ......... 438/91
2006/0157815 A1 7/2006 Chang et al.
2006/0186507 A1 8/2006 Kanda et al.
2007/0063274 A1 3/2007 Kanda et al.

FOREIGN PATENT DOCUMENTS

JP 63-077155 4/1988

OTHER PUBLICATIONS

Tsutomu, Matsushita, et al.; A Surge-Free Intelligent Power Device Specifid to Automotive High Side Switches; IEEE Transactions on Electtron Devices; vol. 38, No. 7, Jul. 1991.

* cited by examiner

*Primary Examiner*—Marcos D. Pizarro
*Assistant Examiner*—Eva Y Montalvo

(57) ABSTRACT

An integrated circuit includes a first and second diode connected in parallel. The first diode has a first breakdown voltage and has first P type region and first N type region adjacent to each other at the surface of the substrate of a substrate to form a lateral diode. The second diode has a second breakdown voltage less than the first breakdown voltage and has a second P type region and second N type region lateral adjacent to each other in the substrate to form a lateral diode below the surface The first and second N type regions overlap and the first and second P type region being electrically connected whereby the first and second diodes are in parallel.

10 Claims, 5 Drawing Sheets

REPETITIVE TLP STRESS RESPONSE - I = 100mA/100ns EVERY 2 SECONDS
- Vgs=0V

| | SAMPLE | RESULTS |
|---|---|---|
| CONTROL | #1 | FAILED AFTER 5 MINUTES |
| | #2 | SURVIVED 12 HOURS, Rdson +14% |
| EMBODIMENT #1 | #1 | SURVIVED 12 HOURS, Rdson UNCHANGED |
| | #2 | SURVIVED 12 HOURS, Rdson UNCHANGED |
| EMBODIMENT #2 | #1 | FAILED AFTER 3 HOURS |
| | #2 | SURVIVED 12 HOURS, Rdson +4% |
| | #3 | SURVIVED 64 HOURS, Rdson UNCHANGED |
| | #4 | SURVIVED 120 HOURS, Rdson UNCHANGED |

FIG. 6

INTEGRATED CIRCUIT WITH A SUBSURFACE DIODE

BACKGROUND AND SUMMARY OF THE DISCLOSURE

The present disclosure relates generally to integrated circuits and, more specifically, to a pair of parallel diodes in the integrated circuit.

Zener or avalanche diodes are used to limit voltages seen by components in an integrated circuit. These diodes are either discrete components external to the integrated circuit or specially integrated into the integrated circuit with the elements they are to protect. Discrete diodes add to the overall costs at the component and the printed circuit board level. Integrated circuit Zener diodes add to the cost by increasing the die area.

Certain circuits parasitic have intentional inductances that lead to large voltage spikes during fast switching events. Voltage spikes frequently exceed the breakdown of the integrated circuit transistors especially, when the transistors drain to source on-resistance is being minimized. Depending upon the device's architecture, repetitive breakdown events lead to hot carrier charge be trapped. Lateral MOS transistors are particularly susceptible.

An integrated circuit of the present disclosure includes a first and second diode connected in parallel. The first diode has a first breakdown voltage and has first P type region and first N type region adjacent to each other at the surface of the substrate to form a lateral diode. The second diode has a second breakdown voltage less than the first breakdown voltage and has a second P type region and second N type region lateral adjacent to each other in the substrate to form a lateral diode below the surface. The first and second N type regions overlap and the first and second P type region are electrically connected whereby the first and second diodes are in parallel.

The second P type and N type regions have a maximum impurity concentration below the surface of the substrate. The substrate may include a lateral insulation, for example a trench in the surface, and the second diode is below the trench. The first and second P type regions may be spaced in the substrate and are electrically connected by interconnects above the substrate. The first and second P type regions may alternatively overlap to form the electrical connection. The first and second P type regions may be a common P type region abutting the first N type region at the surface and the second N type region below the surface. The common P type region and the N type region have a maximum impurity concentration below the surface of the substrate.

The first P type region may be a body of a lateral field effect transistor and the first N type region is a drain region of the field effect transistor. The field effect transistor may be an insulated gate field effect transistor.

These and other aspects of the present disclosure will become apparent from the following detailed description of the disclosure, when considered in conjunction with accompanying drawings.

BRIEF DESCRIPTION OF DRAWINGS

FIG. 6 is a table of the repetitive TLP response of eight samples of the devices of FIG. 1-3.

DETAILED DESCRIPTION OF THE PREFERRED EMBODIMENTS

Figure 1:
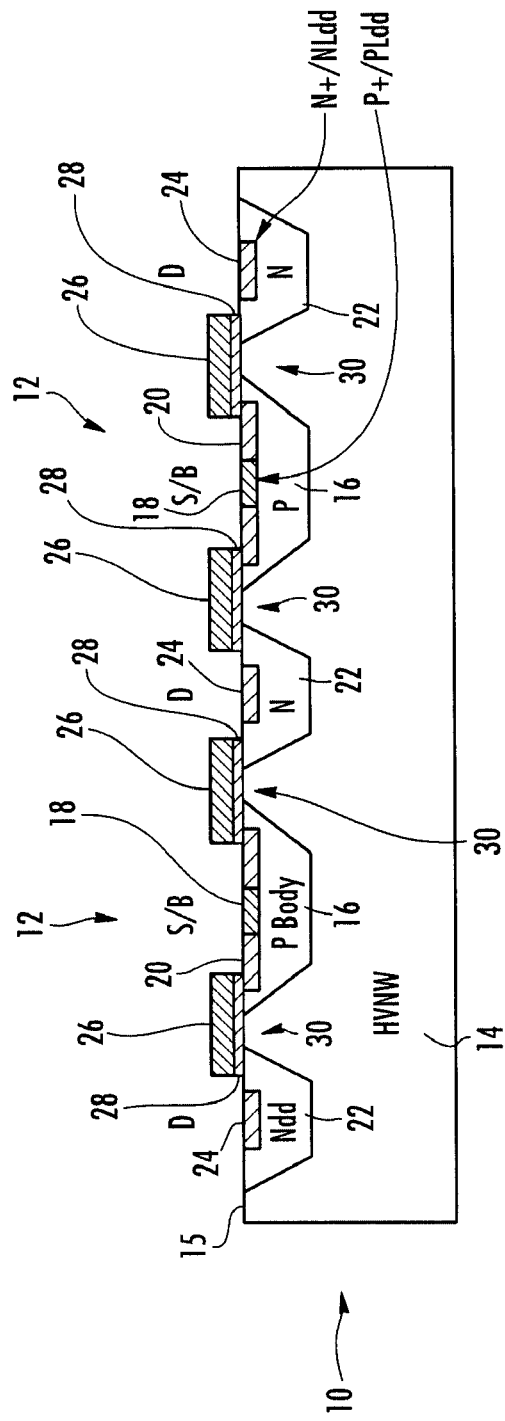
FIG. 1 is cross-sectional view of an integrated circuit of the prior art.

FIG. 1 illustrates an integrated circuit 10 including a field effect transistor FET 12 of the prior art as an example of an integrated circuit in which the subsurface diode of the present disclosure can be used. The integrated circuit includes a substrate 14 shown as a high voltage N type well having a surface 15. Field effect transistor 12 includes a P type body region 16 formed in the surface 15 and a P type contact 18 within the P type body 16. An N type region 20 is formed in the P body 16 as the source region. N type drain region 22 is formed in the surface 15 and spaced from the P body 16 by a surface region 30 of the substrate 14. In some integrated circuits, P type region 16 and N type drain region 22 may overlap. An N type drain contact region 24 is formed in the surface 15 of the N type drain region 22. A gate 26, shown as a polycrystalline region, is separated from the surface 15 by a thin gate insulated or oxide layer 28. The gate 26 extends from the source region 20 across the body region 16 and the adjacent portion of the region 30 of the substrate 14 and onto the drain region 22. The structure is a known example of a lateral field effect transistor.

The cross section is representative of multi drains or fingers of a single field effect transistor or may represent a plurality of parallel field effect transistors. The point of breakdown of the field effect transistors is in the region 30 of the substrate 14 between the P body region 16 and the N drain region 22. The hot carrier charges are trapped in the gate oxide 28 after repetitive breakdown events. This charge trapping shifts the transistor's parameters over time.

Figure 2:
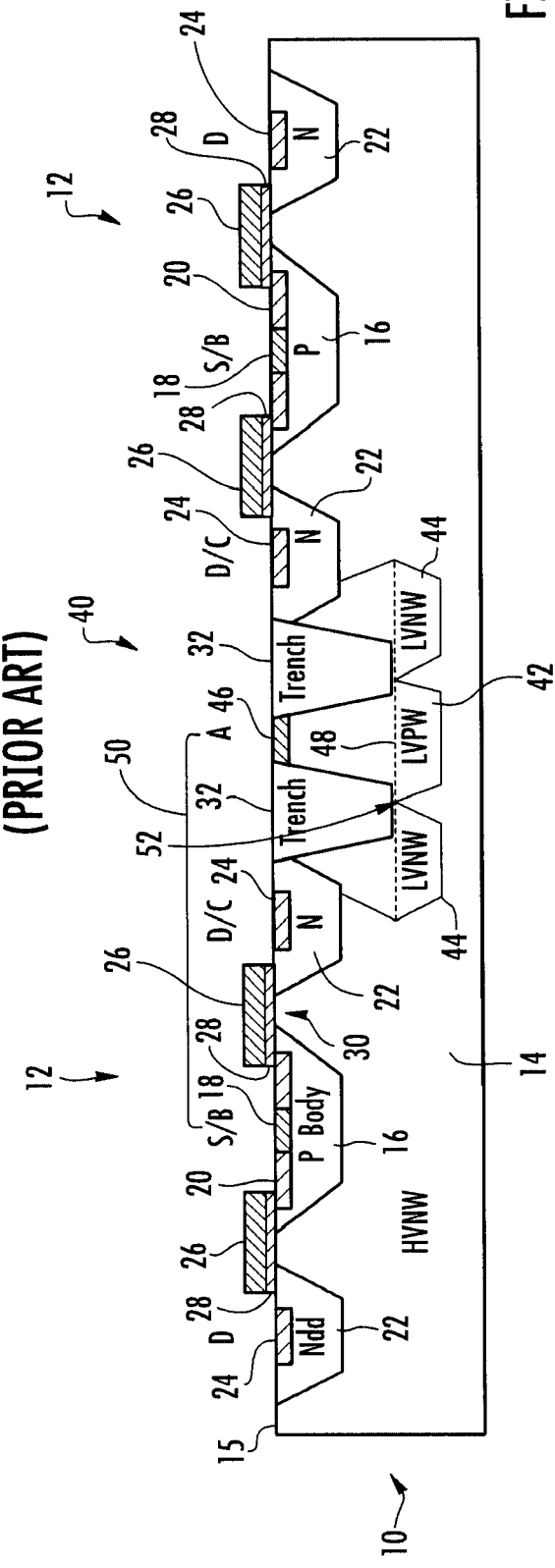
FIG. 2 is cross-sectional view of an integrated circuit including a pair of parallel diodes according to a first embodiment of the present disclosure.

An avalanche diode 40 may be included in the integrated circuit 10 as illustrated in FIG. 2. The transistor's periodicity is broken by the insertion of the avalanche diode 40. The avalanche diode 40 includes a P type anode region 42 adjacent and intersecting an N type cathode region 44. The cathode region 44 overlaps the drain region 22. The anode region 42 includes a P+ anode contact region 46 at the surface 15 of the substrate 14. In this particular embodiment, the anode contact region 46 is electrically connected by interconnects 50 with the P contact 18 for the body 16 of the transistor 12. This places the avalanche diode 40 in parallel with the lateral PN diode formed by the body 16 and the drain 22.

The example in FIG. 2 shows trench isolation regions 32 of insulated material at the intersection of the anode region 42 and the cathode region 44. This displaces the breakdown of the avalanche diode 40 below the surface region 15 of the substrate 14. The breakdown region is illustrated at 52 at the bottom of the trench region 32. It shall also be noted that the anode region 42 and cathode region 44 are formed as retrograde regions where in the maximum impurity concentration, illustrated by dashed line 48, is below the surface 15 of the substrate 14. This may be formed by ion implantation with subsequent diffusion resulting from the various processing steps.

The breakdown voltage of the avalanche diode 40 is less than that of the breakdown voltage of the transistor at region

30. In effect, the structure is two parallel diodes with one of them having a low breakdown voltage and a subsurface breakdown path. Thus the majority of the breakdown current is far away from the gate oxide 28. Accordingly, trapped charge is reduced in the gate oxide so the transistor drift is minimal. The reverse breakdown voltage of the avalanche diode 40 will be generally in the range of 12 to 25 volts depending upon the structure of the anode region 42 and the cathode region 44. It should also be noted that the P+ anode contact 46 can either be embedded into a multi-drain strip arrangement or can be made to the P+ guard ring of the transistor 12 (not shown).

Figure 3:
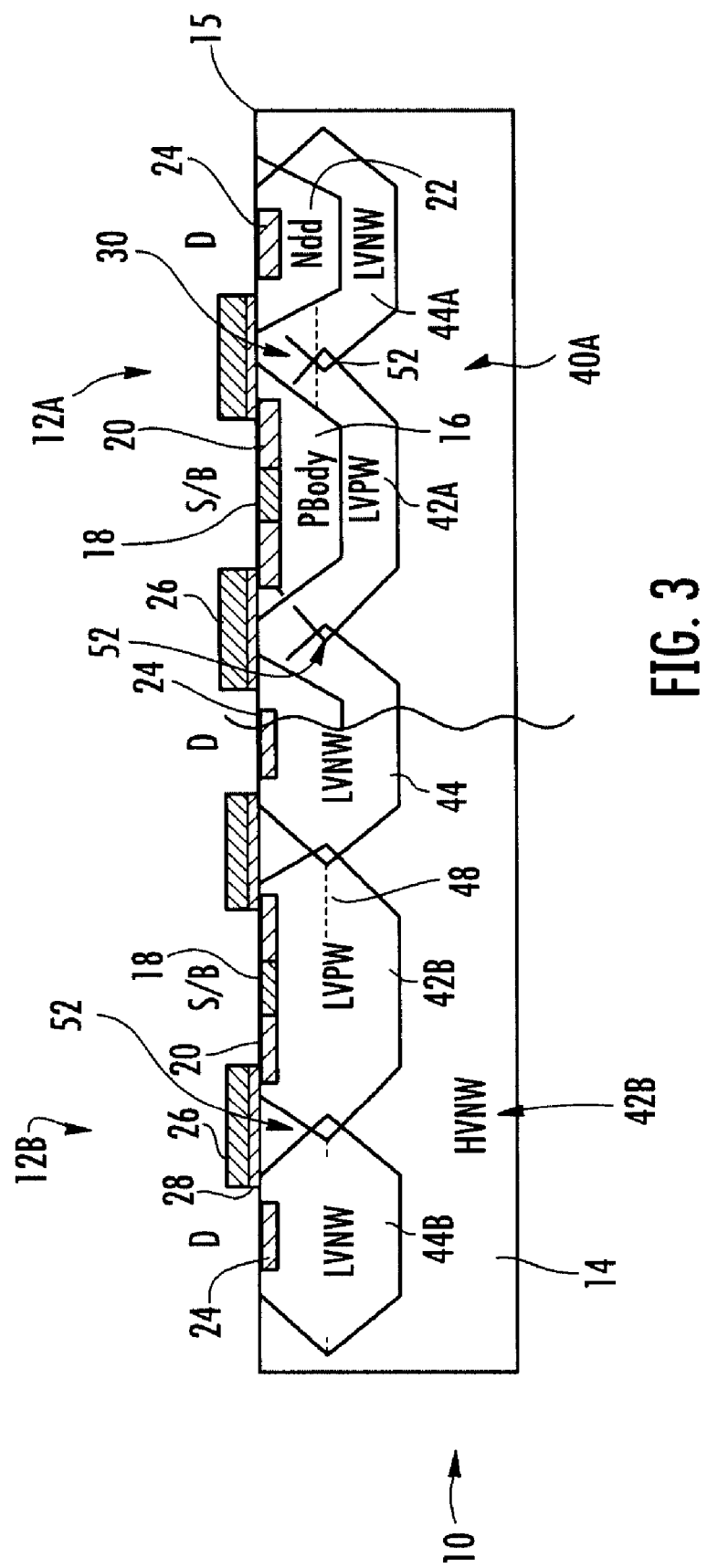
FIG. 3 is cross-sectional view of the integrated circuit including a pair of parallel diodes according to second and third embodiments of the present disclosure.

Two alternative embodiments are shown in FIG. 3. In the right side of FIG. 3, the anode region 42A and the cathode region 44A of diode 40A overlap the body regions 16 and the drain region 22 respectively of transistor 12A. These overlapping regions produce the parallel connection of the two diodes without additional metal interconnects. The region 30 of the substrate 14 has a lower impurity concentration, forming a higher voltage junction with the body region 16. The higher impurity concentration, low junction voltage anode and cathode regions 42A and 44A intersect and have a breakdown path 52 below the surface. The anode region 42A and the cathode region 44A are retrograde regions having their highest impurity concentration at dashed line 48 below the surface 15 of the substrate 14.

On the left side of FIG. 3, the retrograde regions 42B and 44B are coincidence with and formed not only the avalanche diode's 40B anode and cathode regions but also formed the body and the drain regions of the transistor 12B. As with embodiments in FIG. 2, the avalanche diode breakdowns at 52 is below the surface 15 and conducts carries away from the gate oxide 28. The majority of the avalanche current is swept up through the drain and source body terminals. Since the avalanche current does not interact with the gate oxide, transistor drift is reduced.

Using known CMOS fabrication techniques, the integrated circuit's maximum concentration will be at approximately 0.5 to 2 microns from the surface 15. The embodiments of FIGS. 2 and 3 have been created using NWELL and PWELL implants which are part of known standard CMOS process as an example. Further device optimization can be achieved by adding dedicated drain/cathode implants and/or body/anode implants.

Figure 4:
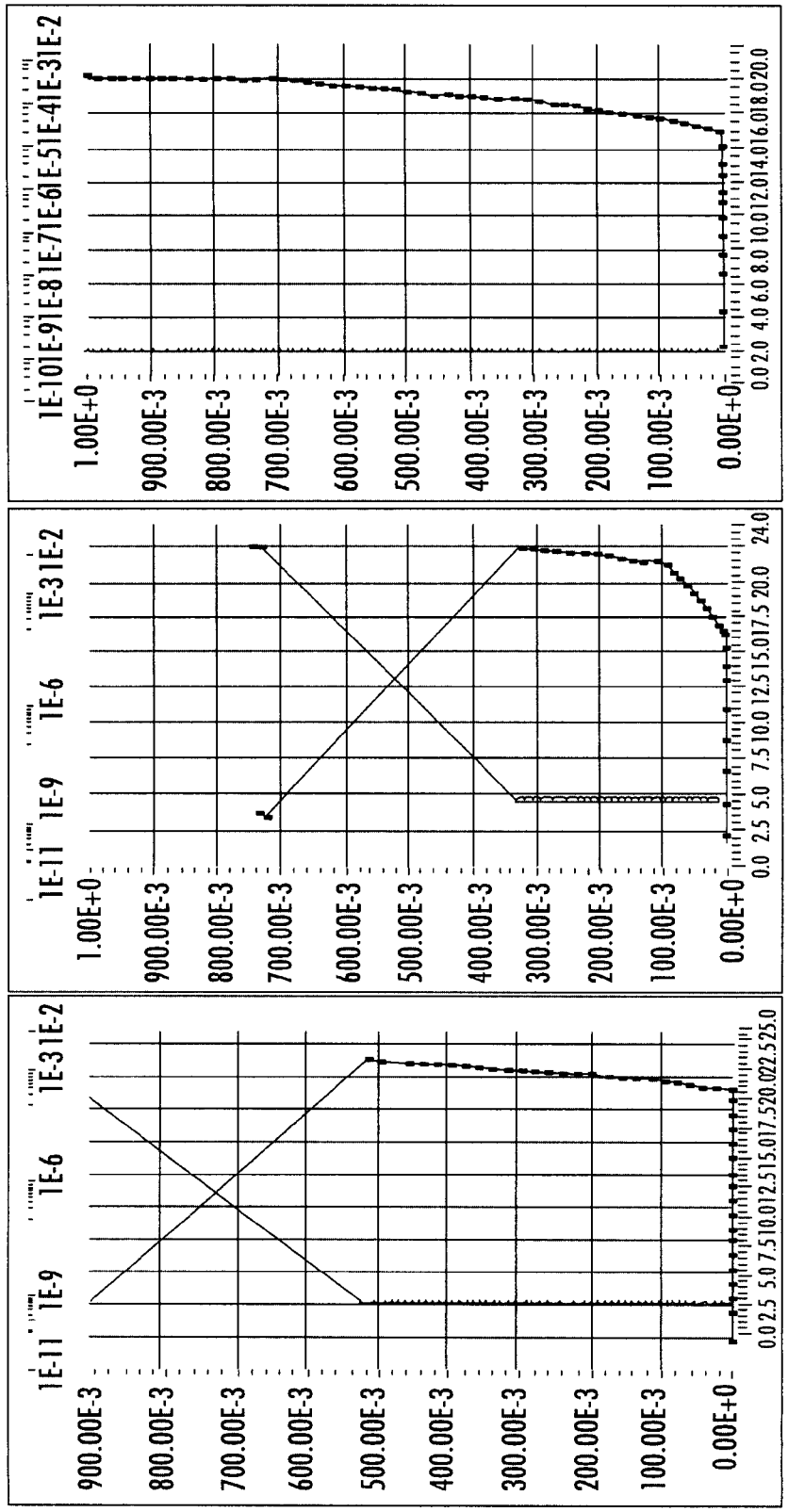
FIGS. 4A-4C are graphs of TLP stress response at Vgs=0 volts for devices of FIG. 1-3 respectively.
Figure 5:
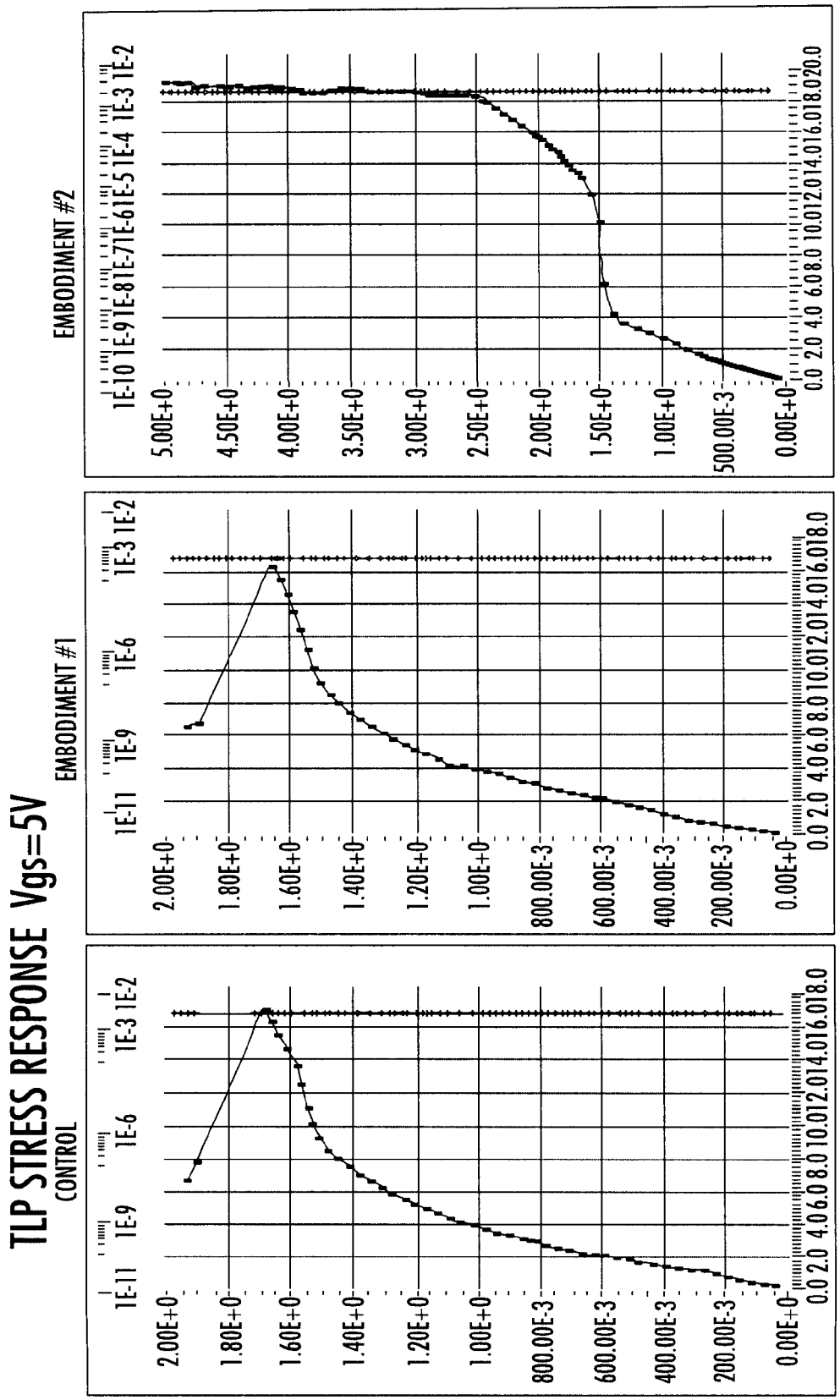
FIGS. 5A-5C are graphs of TLP stress response at Vgs=5 volts for devices of FIG. 1-3 respectively.

The response of various embodiments compared to the prior art are illustrated in FIGS. 4 through 6. The control device is that of prior art FIG. 1, embodiment 1 is that of FIG. 2 and the embodiment 2 is that of transistor 12B and diode 40B of FIG. 3. FIGS. 4A through 4C and 5A though 5C show the TLP stress response at gate to source voltage of zero and five volts respectively.

FIG. 6 is a table of eight samples that were built and tested for the repetitive TLP stress response at a current of 100 microamperes per 100 nanoseconds every two seconds and a gate to source voltage of 0 volts. The failure of sample 1 of embodiment 2 was not reproducible.

From these graphs, it can be seen that the present subsurface avalanche diode provides improved performance and longevity of the transistor.

Even though the present structure has been designed and shown for use as a protective device for field effect transistors, the subsurface avalanche diode may be used with other diode structures to protect other structures from voltage spikes and specifically repetitive voltage spikes.

Although the present disclosure had been described and illustrated in detail, it is to be clearly understood that this is done by way of illustration and example only and is not to be taken by way of limitation. The scope of the present disclosure is to be limited only by the terms of the appended claims.

What is claimed:

1. An integrated circuit comprising:
   a substrate having a surface;
   a first diode having a first breakdown voltage and having first P type region and first N type region adjacent to each other at the surface of the substrate to form a lateral diode;
   a second diode having a second breakdown voltage less than the first breakdown voltage and having a second P type region and second N type region lateral adjacent to each other in the substrate to form a lateral diode having a breakdown region below the surface;
   the second P and N type regions being retrograde regions extending from the breakdown region of the second diode to adjacent the surface; and
   the first and second N type regions overlap and the first and second P type region being electrically connected whereby the first and second diodes are in parallel.

2. The integrated circuit of claim 1, wherein the second P type and N type regions have a maximum impurity concentration below the surface of the substrate.

3. The integrated circuit of claim 1, wherein the substrate includes an insulation trench in the surface and the second diode is below the trench.

4. The integrated circuit of claim 1, wherein the first and second P type regions are spaced in the substrate and are electrically connected by interconnects above the substrate.

5. The integrated circuit of claim 1, wherein the first and second P type regions overlap to form the electrical connection.

6. The integrated circuit of claim 1, wherein the first P type region is a body of a lateral field effect transistor and the first N type region is a drain region of the field effect transistor.

7. The integrated circuit of claim 6, wherein the field effect transistor is an insulated gate field effect transistor.

8. The integrated circuit of claim 1, wherein the first P and N type regions are the same structure as well regions of CMOS lateral field effect transistors.

9. An integrated circuit comprising:
   a substrate having a surface;
   a first diode having a first breakdown voltage and having first P type region and first N type region adjacent to each other at the surface of the substrate to form a lateral diode;
   a second diode having a second breakdown voltage less than the first breakdown voltage and having a second P type region and second N type region lateral adjacent to each other in the substrate to form a lateral diode below the surface; and
   the first and second P type regions being a common P type region abutting the first N type region at the surface and the second N type region below the surface and the first and second N type regions overlap whereby the first and second diodes are in parallel.

10. The integrated circuit of claim 9, wherein the common P type region and the second N type region have a maximum impurity concentration below the surface of the substrate.

* * * * *